(12) United States Patent
Rahman et al.

(10) Patent No.: US 6,952,120 B2
(45) Date of Patent: Oct. 4, 2005

(54) VERSATILE SYSTEM FOR CONTROLLING DRIVER SIGNAL TIMING

(75) Inventors: MD Abidur Rahman, Allen, TX (US);
William E. Grose, Plano, TX (US);
Brett E. Smith, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 10/777,991

(22) Filed: Feb. 12, 2004

(65) Prior Publication Data

US 2005/0179471 A1    Aug. 18, 2005

(51) Int. Cl.[7] .................................................. H03B 1/00
(52) U.S. Cl. ........................ 327/108; 327/103; 327/427
(58) Field of Search ..................... 327/108–112, 170, 327/262, 263, 268, 376, 377, 427, 434, 436, 327/581, 374, 437; 326/82, 83

(56) References Cited

U.S. PATENT DOCUMENTS 5,548,240 A * 8/1996 Bayer ......................... 327/108
6,724,227 B2 * 4/2004 Imai ........................... 327/108
6,836,173 B1 * 12/2004 Yang .......................... 327/108

* cited by examiner

Primary Examiner—Long Nguyen
(74) Attorney, Agent, or Firm—J. Dennis Moore; W. James Brady, III; Frederick J. Telecky, Jr.

(57) ABSTRACT

The present invention provides a system (200) for controlling drive signal timing parameters of an output driver circuit (206). The present invention defines a driver circuit having an output interface (204), and a first transistor (222) coupled to a first voltage supply (230), a first control signal (232), and a first node (220). The circuit also has a first resistive element, coupled between the first node and a second node (234). A second resistive element (228) is coupled to ground. A second transistor (224) is coupled to the second node, to a second control signal (236), and the second resistive element. The circuit has a third transistor (244), coupled to the first and second nodes, and to a third node (240). A third resistive element (242) is coupled between the third node and the output interface. A fourth transistor (238) is coupled to the first and third nodes, and to the output interface. The circuit also has a fifth transistor (216), coupled to a second voltage supply (218), to the first node, and to the output interface.

21 Claims, 1 Drawing Sheet

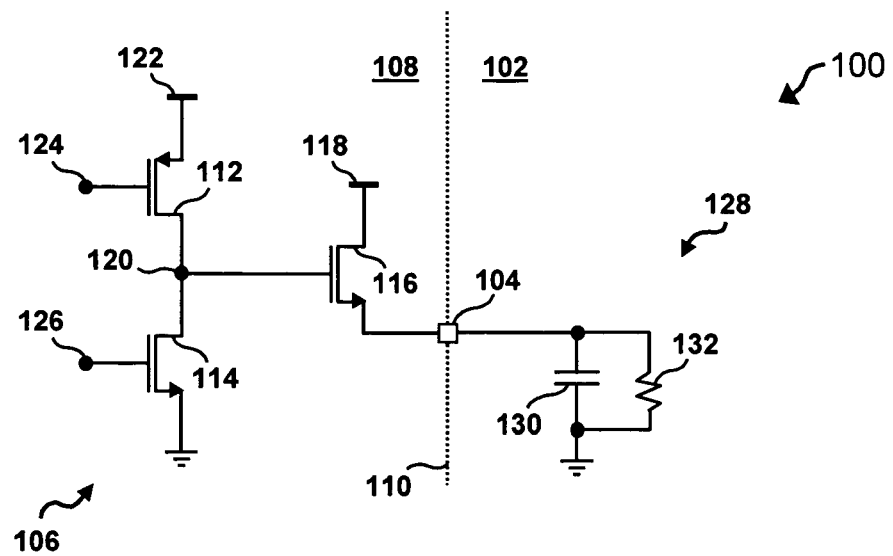
FIG. 1 (*Prior Art*)
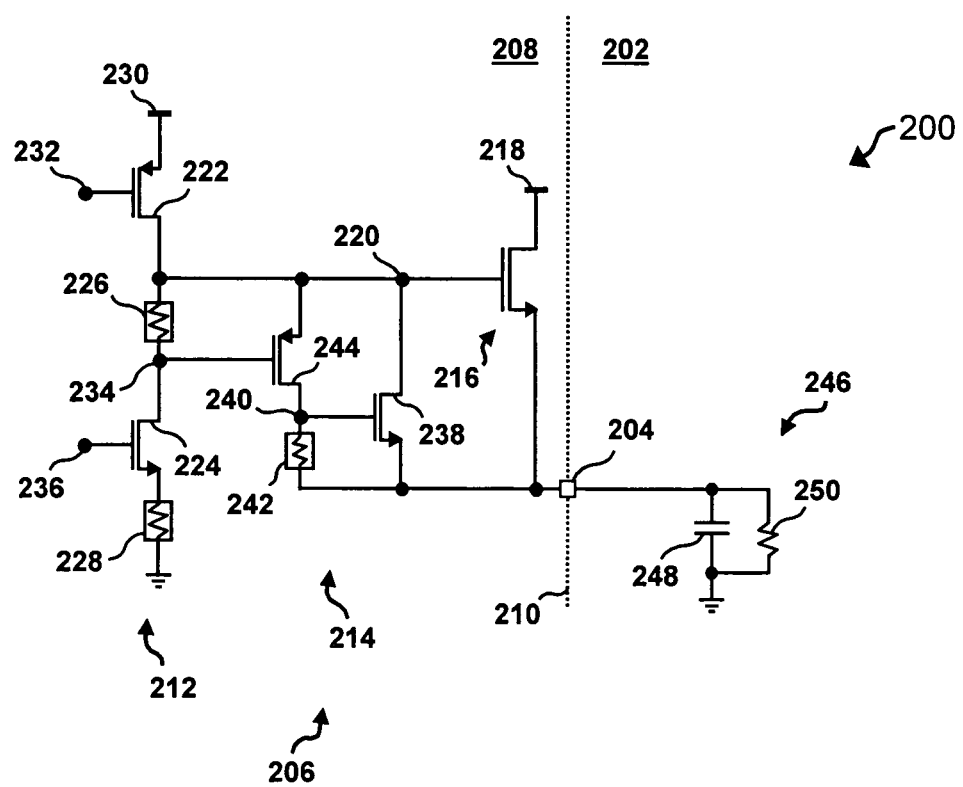
FIG. 2

US 6,952,120 B2

VERSATILE SYSTEM FOR CONTROLLING DRIVER SIGNAL TIMING

TECHNICAL FIELD OF THE INVENTION

The present invention relates generally to the field of semiconductor devices and, more particularly, to apparatus and methods for controlling drive signal timing in driver circuitry.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor device properties and behaviors.

The increased packing density of the integrated circuit generates numerous challenges to the semiconductor manufacturing process. Every device must be smaller without damaging the operating characteristics of the integrated circuit devices. High packing density, low heat generation, low power consumption, and good reliability must be maintained while satisfying a number of critical performance parameters.

Commonly, system designers specify or define a number or required operational parameters (e.g., max/min voltage, signal timing) for certain circuitry segments in a system. Semiconductor devices (i.e., integrated circuits) must comply with such required parameters in order to be used in the system. For example, a system may require that a semiconductor device operate over supply voltage range of 10V to 20V, optimized for performance at 15V. In another example, a system may require that a semiconductor device provide a specified timing parameter (e.g., $t_{rise(MIN)}$, $t_{fall(MAX)}$).

Unfortunately, however, there are a large number of variables in semiconductor device manufacturing that can affect any given performance parameter. Intra-process variations, feature matching issues, and layout considerations are among a number of concerns that impact a device manufacturer's ability to provide a specified performance parameter. In some cases, a semiconductor device's standard operational parameters may be sufficient to provide a required performance level in a given system. In a number of other cases, however, a given system may require a very specific or peculiar performance parameter—such that an integrated circuit must be designed specifically for that application, if possible.

Consider, for example, the conventional circuitry system 100 illustrated in prior art FIG. 1. System 100 depicts a portion of a common high side driver circuit application, illustrating some of the concerns mentioned above. System 100 comprises an end equipment system 102 coupled, via an operative interface 104 (e.g., a pin), to an integrated circuit segment 106 within semiconductor device 108. For purposes of illustration, symbolic boundary 110 demarcates an operational border (e.g., physical, electrical), between device 106 and system 102, and along which interface 104 is disposed.

Segment 106 comprises a high side driver circuit, having a first transistor 112, a second transistor 114, and a third transistor 116. Transistor 116 has a first terminal coupled to supply voltage 118, a second terminal coupled to node 120, and a third terminal—which serves as an output for segment 106—coupled to interface 104. Transistor 112 has a first terminal coupled to supply voltage 122, a second terminal coupled to node 124, and a third terminal coupled to node 120. Transistor 114 has a first terminal coupled to node 120, a second terminal coupled to node 126, and a third terminal coupled to ground.

Segment 106 is utilized to drive an operational load 128 within system 102. Load 128 is represented in FIG. 1 by capacitor 130 and resistor 132, coupled in parallel between interface 104 and ground. Load 128 may comprise any operational load (e.g., another semiconductor device, an electro-mechanical assembly, an antenna) requiring a drive signal of a specified voltage. Appropriate control signals are asserted at nodes 124 and 126 to turn transistor 116 on and off, as desired. For purposes of explanation and illustration, transistor 116 is depicted as an NMOS transistor. When on, transistor 116 supplies load 128 with a desired drive signal. Again, for purposes of explanation and illustration, it is assumed that—through the selection of supply voltages 118 and 122, and the size and layout its constituent components—segment 106 supplies load 128 with sufficient voltage for operation of system 102.

If, however, rise and fall times of a drive signal originating from segment 106 are particularly critical, then certain issues may arise in system 100. Where a target propagation delay—between the time at which a driver off or on signal is asserted at nodes 124 and 126 and the time at which the voltage at interface 104 has sufficiently dissipated or charged, respectively—must be relatively small, common circuit phenomena can have significant consequences. Signal fall times and propagation delays are typically affected to a greater extent, since—generally—device discharge phenomena tend to be more problematic than device charging phenomena. For example, capacitive coupling effects from load 128 can impede the discharge of transistor 116 through load 128 and, consequently, extending the actual fall time and propagation delay beyond the target. This can present a significant problem, especially in a number of modern end-equipment applications where increasingly faster data transfer and performance rates are demanded.

Certain conventional systems have attempted to adjust or control the propagation delay by incorporating some sort of alternative discharge path from transistor 116. Unfortunately, a number of these conventional systems channel that discharge through the semiconductor device itself, not load 128. This increases power dissipation in device 108. Furthermore, circuitry and routing for such a purpose can add considerable design and fabrication overhead to a semiconductor device. Such an approach usually results in increased costs, decreased reliability, or yield problems.

Some conventional systems rely directly on complementing MOS structures (e.g., PMOS) as a supplemental discharge mechanism for transistor 116 (NMOS). In most semiconductor fabrication processes, however, there are considerable process variations and tolerances between the complementary technologies. As a result, inexact device matching can, and often does, occur. This can shift propagation delays on a device-to-device, wafer-to-wafer or lot-to-lot basis—profoundly degrading overall device reliability. Furthermore, such approaches can create undesirable circuitry behaviors—such as overdriving the output into cutoff, or loss of fall time control. Overdriving the output into cutoff can cause an output fall time to have a large dv/dt during a portion of the fall time.

In other instances, where such discharge systems are not implemented, devices may simply be screened or tested for parameter compliance. When a device is non-compliant, it is scrapped—degrading yield and increasing costs.

As a result, there is a need for a system that provides accurate and manageable control of drive signal timing parameters through driver circuitry—satisfying critical timing requirements and providing reliable device performance in an easy, efficient and cost-effective manner.

SUMMARY OF THE INVENTION

The present invention provides a versatile system of methods and structures that accurately control drive signal fall times and propagation delay through a driver circuitry segment in a constrained and efficient manner. The system of the present invention provides driver circuitry that satisfies stringent timing requirements while delivering reliable device performance in an easy, efficient and cost-effective manner—overcoming certain limitations associated with conventional approaches.

Specifically, the present invention provides a low impedance output discharge system that channels discharge current to an operational load attached thereto. The system of the present invention provides a discharge structure and an output structure fabricated from homogeneous semiconductor material types. The system of the present invention provides a pre-drive system comprising elements for selectively controlling signal fall time for the output structure. As a result, system performance and reliability is optimized with minimal augmentation of semiconductor device layout and fabrication.

More specifically, one embodiment of the present invention provides a driver circuit having an output interface. A pre-drive drive system is coupled to a first supply voltage and to a first control signal and a second control signal, and has a fall time control function. A discharge system is coupled to the pre-drive system at a first node and a second node, is coupled to the output interface, and has a switching structure and a discharge structure. An output structure is coupled to a second supply voltage, to the pre-drive system at the first node, to the discharge system, and to the output interface. The circuit is adapted to, responsive to assertion of the first control signal, deactivate the discharge system, activate the output structure and supply an output drive signal to the output interface. Responsive to assertion of the second control signal, the circuit activates the discharge system, deactivates the output structure and discharges the output structure, through the output interface, at a rate determined by the fall time control function.

Another embodiment of the present invention provides method of providing a driver circuitry segment having a particular output signal fall time. The method includes providing an output interface within the circuitry segment. A pre-drive drive system is coupled to a first supply voltage and first and second control signals, having a fall time control function. A switchable discharge system is also provided, coupled to the pre-drive system at a first node and a second node, and coupled to the output interface. The method further provides an output structure, coupled to a second supply voltage, to the pre-drive system at the first node, to the discharge system, and to the output interface. The pre-drive system, the discharge system and the output structure are operated such that, responsive to assertion of the first control signal, the discharge system is deactivated and the output structure is activated to supply an output drive signal to the output interface, and, responsive to assertion of the second control signal, the discharge system is activated and the output structure is deactivated and discharges, through the output interface, at a rate determined by the fall time control function.

The present invention further provides a driver circuit having an output interface and a first transistor. The first transistor is coupled to a first voltage supply, a first control signal, and a first node. The circuit also has a first resistive element, coupled between the first node and a second node. A second resistive element is coupled to ground. A second transistor is coupled to the second node, to a second control signal, and the second resistive element. The circuit has a third transistor, coupled to the first and second nodes, and to a third node. A third resistive element is coupled between the third node and the output interface. A fourth transistor is coupled to the first and third nodes, and to the output interface. The circuit also has a fifth transistor, coupled to a second voltage supply, to the first node, and to the output interface.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which:

FIG. 1 is an illustration of a PRIOR ART driver circuitry application; and

FIG. 2 is an illustration depicting one embodiment of a driver circuitry application according to the present invention.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The invention will now be described in conjunction with high side driver circuitry utilized in an end equipment system that requires minimal propagation delays, controlled rise and fall times, and variable driver supply voltages. The specific embodiments discussed herein are, however, merely illustrative of specific ways to make and use the invention and do not limit the scope of the invention.

The system of the present invention provides a versatile system, comprising various methods and structures, providing accurate control of drive signal fall time and propagation delay through a driver circuitry segment in a constrained and efficient manner. The present invention provides a low impedance discharge structure that conducts discharge current through driver output structure to an operational load attached thereto. The discharge structure and output structure of the present invention are fabricated from homogeneous semiconductor material types—eliminating overdrive problems associated with complementary material solutions. The system of the present invention provides a pre-drive system comprising elements for selectively controlling signal fall time for the output structure. As a result, the present invention optimizes system performance and reliability with minimal augmentation of semiconductor device layout and fabrication. The present invention thus provides driver circuitry that satisfies stringent system timing requirements, while delivering reliable device performance in an easy, efficient and cost-effective manner.

As previously discussed, output driver circuitry without some sort of supplemental discharge mechanism is susceptible to extended propagation delays due to, among other things, capacitive coupling effects of loads coupled thereto. Even where output driver circuitry incorporates some form of supplemental discharge mechanism, such a mechanism often does not conduct discharge current directly to the output-coupled load, or relies directly on complementary discharge structures. A number of issues and complications arise therefrom, including, for example, increased semiconductor overhead and detrimental overdrive conditions.

In contrast, a system according to the present invention obviates many such issues. Referring now to FIG. 2, a circuitry system 200 in accordance with the present invention is illustrated. System 200 depicts a portion of a high side output driver circuit application, similar to that of system 100. System 200 comprises an end equipment system 202 coupled, via an operative interface 204 (e.g., a pin), to an integrated circuit segment 206 within semiconductor device 208. For purposes of illustration, symbolic boundary 210 demarcates an operational border (e.g., physical, electrical), between device 206 and system 202, and along which interface 204 is disposed.

System 202 may have several critical performance requirements that segment 206 must fulfill. For example, system 202 may require minimal drive signal propagation delay, but controlled rise and fall times. In addition, system 202 may require that segment 206 be operable at variable driver supply voltages.

In response, segment 206 comprises a high side output driver circuit, having a pre-drive system 212, a discharge system 214, and an output structure 216. In the embodiment depicted in FIG. 2, output structure 216 comprises a single, relatively large, NMOS transistor. In alternative embodiments, other output structures of varying complexity and composition may be utilized in accordance with the present invention. Transistor 216 has: a first terminal, its drain, coupled to driver supply voltage 218; a second terminal, its gate, coupled to node 220; and a third terminal, its source, which serves as an output for segment 206, coupled to interface 204.

In this embodiment, pre-drive system 212 comprises transistors 222 and 224 and resistive elements 226 and 228. As depicted in FIG. 2, transistor 222 comprises a PMOS transistor and transistor 224 comprises an NMOS transistor. In alternative embodiments, however, other device types and combinations—providing necessary pre-drive and control performance in accordance with the present invention—may be utilized. As further depicted in FIG. 2, elements 226 and 228 comprise fixed value single resistors. Elements 226 and 228 constitute a fall time control function. The resistive values of this function are selected to provide a desired drive signal fall time or rate. As the resistive values of the fall time function are increased, the resistive elements will take more time to charge—extending the drive signal fall rate and increasing propagation delay. Conversely, as the resistive values of the fall time function are decreased, the resistive elements will take less time to charge— shortening the drive signal fall rate and decreasing propagation delay. In alternative embodiments, elements 226 and 228 may comprise an element or plurality of elements (e.g., potentiometer, parallel or serial combinations of resistors) to provide fixed or adjustable fall time control in accordance with the present invention.

In the embodiment depicted in FIG. 2, transistor 222 has: a first terminal, its source, coupled to supply voltage 230; a second terminal, its gate, coupled to control node 232; and a third terminal, its drain, coupled to node 220. Transistor 224 has: a first terminal, its drain, coupled to node 234; a second terminal, its gate, coupled to control node 236; and a third terminal, its source, coupled to a first terminal of element 228. Element 228 has a second terminal coupled to ground. Element 226 is intercoupled between nodes 220 and 234.

Discharge system 214 comprises a discharge structure 238, formed of the same material type as structure 216. In the embodiment depicted in FIG. 2, structure 238 comprises a small NMOS transistor, relative to the size of transistor 216. Transistor 238 has: a first terminal, its drain, coupled to node 220; a second terminal, its gate, coupled to node 240; and a third terminal, its source, coupled to output interface 204. The relative size of transistor 238 may be some fraction of, or even down to several orders of magnitude smaller than, the size of transistor 216. In alternative embodiments, the width to length (W/L) ratio of transistor 238 may be increased or decreased to reduce or extend, respectively, the fall time of an output drive signal from segment 206, in accordance with the present invention. Transistor 238 provides a gate to source pull-down path for transistor 216—one that channels discharge current directly to output 204. System 214 further comprises a resistive element 242 intercoupled between node 240 and output 204, and a switching structure 244. In the embodiment depicted in FIG. 2, structure 244 comprises a PMOS transistor having: a first terminal, its source, coupled to node 220; a second terminal, its gate, coupled to node 234; and a third terminal, its drain, coupled to node 240. In alternative embodiments, other structures—providing switching functionality for structure 238 in accordance with the present invention—may be utilized.

Segment 206 is utilized to drive an operational load 246 within system 202. Load 246 is represented in FIG. 2 by capacitor 248 and resistor 250, coupled in parallel between interface 204 and ground. Load 246 may comprise any operational load (e.g., another semiconductor device, an electro-mechanical assembly, an antenna) requiring a drive signal having specific voltage and timing demands.

Operationally, system 200 functions similarly to system 100—with a number of important distinctions. When segment 206 is activated to supply a drive signal to load 246 (i.e., "on" state), appropriate control signals are asserted at nodes 232 and 236 to render transistor 222 active and transistor 224 inactive. Consequently, no charge is induced across element 226, and system 214 is in a passive, or inactive, state. Transistor 222 activates structure 218, which supplies a desired drive signal—obtained via supply 218—to load 246 via interface 204. In system 200, only transistors 222 and 216 are active during the "on" state for segment 206. Voltage 218 may thus be varied to provide differing drive voltages, according to the requirements of system 202.

When segment 206 is deactivated to terminate a drive signal to load 246 (i.e., "off" state), appropriate control signals are asserted at nodes 232 and 236 to render transistor 222 inactive and transistor 224 active. Consequently, a charge is induced across element 226, and system 214 is activated. Transistor 244 turns on, inducing a charge across element 242 and activating transistor 238. Transistor 238 provides a low impedance discharge path between the gate and source of transistor 216. This accelerates the discharge of transistor 216 and, as a result, decreases the drive signal fall time and propagation delay. Such acceleration is insulated from overdrive concerns, however, due to the matching material types of transistors 216 and 238. Additionally, drive signal fall time and propagation delay are well controlled independent of supply voltage. The present invention, by system 214, further obviates capacitive coupling difficulties experienced in conventional systems. Moreover, structure 238 channels supplemental discharge current to load 246—via output 204—and not into device 208. This reduces layout overhead and lowers power dissipation within device 208—improving design efficiency, cost, and reliability.

The system of the present invention thus provides versatile control of drive signal timing and delay through a driver circuit, independent of supply voltage values. The system of the present invention comprises a discharge system that adds minimal silicon overhead to a driver device. The system of the present invention comprises discharge and output structures of matching material types—reducing design sensitivity to process variations. The present invention thus provides a very efficient and versatile system; adaptable to a number of end-equipment applications. Based upon the specific needs of system 202, the relative sizes or values of structures 216, 222, 224, 238 and 244, and of elements 226, 228 and 242, may be varied independently, collectively, or combinationally to meet particular drive signal strength and timing (e.g., fall time, propagation delay) requirements of system 202.

As previously discussed, the embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As indicated, a number of modifications and variations are possible in light of the above teaching without departing from the spirit and scope of the following claims.

What is claimed is:

1. A driver circuit comprising:
   an output interface;
   a pre-drive system coupled to a first supply voltage, to ground, to a first control signal and to a second control signal, and having a fall time control function;
   a discharge system, coupled to the pre-drive system at a first node and a second node, coupled to the output interface, and having a switching structure and a discharge structure;
   an output structure, coupled to a second supply voltage, to the pre-drive system at the first node, to the discharge system, and to the output interface;
   wherein the driver circuit is adapted to, responsive to assertion of the first control signal, deactivate the discharge system, activate the output structure and supply an output drive signal to the output interface, and, responsive to assertion of the second control signal, activate the discharge system, deactivate the output structure and discharge the output structure, through the output interface, at a rate determined by the fall time control function.

2. The circuit of claim 1, wherein the driver circuit comprises a high side output driver circuit.

3. The circuit of claim 1, wherein the driver circuit is implemented within a semiconductor device.

4. The circuit of claim 3, wherein the output interface comprises a pin on the semiconductor device.

5. The circuit of claim 1, wherein the pre-drive system comprises:
   a first resistive element, having a first terminal coupled to the first node and a second terminal coupled to the second node;
   a second resistive element, having first terminal, and a second terminal coupled to the ground;
   a first transistor, having a first terminal coupled to the first supply voltage, a second terminal coupled to the first control signal, and a third terminal coupled to the first terminal of the first resistive element; and
   a second transistor, having a first terminal coupled to the second terminal of the first resistive element, a second terminal coupled to the second control signal, and a third terminal coupled to the first terminal of the second resistive element;
   wherein the fall time control function is provided by the first and second resistive elements.

6. The circuit of claim 5, wherein the first resistive element comprises a fixed value resistor.

7. The circuit of claim 5, wherein the second resistive element comprises a fixed value resistor.

8. The circuit of claim 5, wherein the first and second transistors are formed of complementary conductivity types.

9. The circuit of claim 5, wherein the first transistor is a P-type MOS transistor and the second transistor is an N-type MOS transistor.

10. The circuit of claim 1, wherein the output structure comprises a transistor, having a first terminal coupled to the second voltage supply, a second terminal coupled to the first node, and a third terminal coupled to the output interface.

11. The circuit of claim 10, wherein the transistor is an N-type MOS transistor.

12. The circuit of claim 1, wherein:
   the switching structure has a first terminal coupled to the first node, a second terminal coupled to the second node, and a third terminal coupled to a third node; and
   the discharge structure has first terminal coupled to the first node, a second terminal coupled to the third node, and a third terminal coupled to the output interface;
   and wherein the discharge system further comprises:
   a resistive element, having a first terminal coupled to the third node and a second terminal coupled to the output interface.

13. The circuit of claim 12, wherein the discharge structure comprises a transistor.

14. The circuit of claim 12, wherein the discharge structure and the output structure are formed of matching conductivity types.

15. The circuit of claim 14, wherein the discharge structure and the output structure each comprise an N-type MOS transistor.

16. The circuit of claim 12, wherein the switching structure comprises a transistor.

17. The circuit of claim 16, wherein the switching structure and the discharge structure are formed of complementary conductivity types.

18. A method of providing a driver circuitry segment having a particular output signal fall time, the method comprising the steps of:
   providing an output interface;

providing a pre-drive drive system, coupled to a first supply voltage, ground and first and second control signals, having a fall time control function;

providing a switchable discharge system, coupled to the pre-drive system at a first node and a second node, coupled to the output interface;

providing an output structure, coupled to a second supply voltage, to the pre-drive system at the first node, to the discharge system, and to the output interface;

operating the pre-drive system, the discharge system and the output structure such that, responsive to assertion of the first control signal, the discharge system is deactivated and the output structure is activated to supply an output drive signal to the output interface, and, responsive to assertion of the second control signal, the discharge system is activated and the output structure is deactivated and discharges, through the output interface, at a rate determined by the fall time control function.

19. The method of claim 18, wherein the step of providing a fall time control function further comprises providing a plurality of resistive elements within the pre-drive system, configured to induce the particular output signal fall time at the output interface.

20. The method of claim 18, wherein the steps of providing an output structure and providing a switchable discharge system further comprise providing, in each structure, a transistor of a matching conductivity type.

21. An output driver circuit formed within a semiconductor device, the circuit comprising:

an output interface;

a first transistor, having a first terminal coupled to a first voltage supply, a second terminal coupled to a first control signal, and a third terminal coupled to a first node;

a first resistive element, having a first terminal coupled the first node, and having a second terminal coupled to a second node;

a second resistive element, having a first terminal, and having a second terminal coupled to ground;

a second transistor, having a first terminal coupled to the second node, a second terminal coupled to a second control signal, and a third terminal coupled to the second terminal of the second resistive element;

a third transistor, having a first terminal coupled to the first node, a second terminal coupled to the second node, and a third terminal coupled to a third node;

a third resistive element, having a first terminal coupled to the third node, and having a second terminal coupled to the output interface;

a fourth transistor, having a first terminal coupled to the first node, a second terminal coupled to the third node, and a third terminal coupled to the output interface; and a fifth transistor, having a first terminal coupled to a second voltage supply, a second terminal coupled to the first node, and a third terminal coupled to the output interface.

* * * * *